United States Patent [19]

Bornzin et al.

[11] Patent Number: 4,725,128
[45] Date of Patent: Feb. 16, 1988

[54] METHOD FOR DELIVERING LIGHT FROM MULTIPLE LIGHT EMITTING DIODES OVER A SINGLE OPTICAL FIBER

[75] Inventors: Gene A. Bornzin, Coon Rapids; Jeffrey A. Schweitzer, Minneapolis; George P. Seifert, Shoreview, all of Minn.

[73] Assignee: Medtronic, Inc., Minneapolis, Minn.

[21] Appl. No.: 799,884

[22] Filed: Nov. 20, 1985

[51] Int. Cl.$^4$ .................. G02B 6/00; H01L 33/00; H01J 5/16; B31B 1/60
[52] U.S. Cl. ................... 350/320; 350/96.20; 350/96.17; 357/17; 357/19; 250/227; 156/60; 156/64
[58] Field of Search ............ 350/96.15, 96.16, 96.17, 350/96.20, 320; 357/74, 75, 80, 84, 17, 19, 30 E, 30 G, 30 H; 250/227; 156/60, 64, 293

[56] References Cited

U.S. PATENT DOCUMENTS

| | | | |
|---|---|---|---|
| 3,912,364 | 10/1975 | Hudson | 350/96.15 X |
| 4,186,996 | 2/1980 | Bowen et al. | 350/96.20 |
| 4,213,670 | 7/1980 | Milton et al. | 350/96.20 X |
| 4,216,486 | 8/1980 | Geddes | 357/19 |
| 4,243,297 | 1/1981 | Elion | 350/96.15 |
| 4,305,641 | 12/1981 | Witte | 350/96.16 |
| 4,329,190 | 5/1982 | Berg et al. | 357/17 X |
| 4,355,863 | 10/1982 | Aulich et al. | 350/96.15 |
| 4,374,390 | 2/1983 | Lee | 357/17 |
| 4,394,061 | 7/1983 | Schroeder | 350/96.20 |
| 4,407,668 | 10/1983 | Aulich et al. | 65/3.11 |
| 4,410,346 | 10/1983 | Aulich et al. | 65/4.2 |
| 4,449,783 | 5/1984 | Witte | 350/96.15 X |
| 4,585,300 | 4/1986 | Landis et al. | 350/96.20 |
| 4,605,942 | 8/1986 | Camlibel et al. | 357/17 |
| 4,653,847 | 3/1987 | Berg et al. | 350/96.20 |
| 4,678,271 | 7/1987 | Beaulieu | 350/96.20 |
| 4,679,908 | 7/1987 | Goodwin | 350/320 |
| 4,691,987 | 9/1987 | Ebner et al. | 350/320 X |

OTHER PUBLICATIONS

Stearns et al., "Angular Division Multiplexer . . . Lenses", J. of Lightwave Tech., vol. LT-2, No. 4, Aug. 84, pp. 358-362.

Primary Examiner—William L. Sikes
Assistant Examiner—Brian M. Healy
Attorney, Agent, or Firm—Reed A. Duthler; John L. Rooney; Joseph F. Breimayer

[57] ABSTRACT

A multiple wavelength light source and a method of constructing a multiple wavelength light source. The light source includes a plurality of light emitting diodes mounted to a substrate, located closely adjacent to one another. A single optical fiber is mounted to the substrate, appropriately positioned to provide a desired ratio of wavelengths at a desired amplitude.

5 Claims, 5 Drawing Figures

METHOD FOR DELIVERING LIGHT FROM MULTIPLE LIGHT EMITTING DIODES OVER A SINGLE OPTICAL FIBER

BACKGROUND OF THE INVENTION

This invention pertains generally to multiple wavelength light sources, and in particular to fiber optic light sources.

Typically, delivery of light of a plurality of wavelengths, derived from a plurality of light sources over a single optical fiber has been accomplished using fiber optic mixers or combiners. Using such mixers, individual optical fibers, each coupled to a separate light source, would be coupled to the input end of an optical mixer. Each fiber emerging from the output end of the optical mixer would include light from all input fibers. Typical prior art mixing elements included mixers in which the fibers were fused to one another, for example as in U.S. Pat. No. 4,305,641 issued to Witte and U.S. Pat. No. 4,410,346 issued to Aulich et al. Alternatively, mixing has been accomplished by closely aligned slits or openings in the cladding layer of optical fibers, as illustrated in U.S. Pat. Nos. 4,355,863 and 4,407,668 also issued to Aulich et al. Alternatively, optical mixing has been accomplished by coupling input and output optical fibers to a wave guide, as illustrated in U.S. Pat. No. 3,912,364 issued to Hudsen, U.S. Pat. No. 4,213,670 issued to Milton et al, U.S. Pat. No. 4,449,783 issued to Witte, and U.S. Pat. No. 4,243,297 issued to Elion.

SUMMARY OF THE INVENTION

The present invention provides an economical, simple, and efficient method of combining light of different wavelengths, generated by a plurality of light emitting diodes. This method avoids the necessity of bulky and expensive optical mixers or combiners, and allows fabrication of a multiple wavelength light source using a single optical fiber. In addition, this method provides an easy and effective method of accomplishing mixing of light generated by the various LED sources in any desired ratio.

The method involves locating light emitting diodes emitting the desired frequencies as closely adjacent one another as is possible on an insulative substrate. A single optical fiber is thereafter placed in close proximity to the LEDs, perpendicular to the plane of the substrate, and its position is adjusted horizontally and vertically until the desired wavelength ratios and amplitudes are obtained, and the fiber is thereafter permanently fixed at that position. This method, and the multiple wavelength light source it produces is discussed in more detail below in conjunction with the following detailed description of the invention.

DETAILED DESCRIPTION OF THE DRAWINGS

Figure 1:
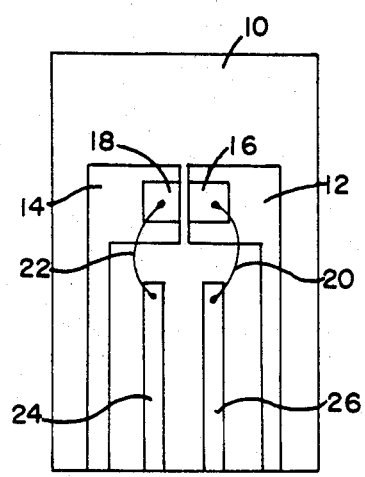
FIG. 1 illustrates a plan view of a substrate carrying two light emitting diodes, useful in the present invention.

FIG. 1 illustrates a substrate and two LEDs for use in a two wavelength light source according to the present invention. Substrate 10 may be a ceramic substrate, carrying four metallized pads 12, 14, 24 and 26. Metallized layers 12 and 14 take the form of mounting pads, for mounting the LEDs 16 and 18. LEDs 16 and 18 are mounted in as close proximity to one another as is possible. LEDs 16 and 18 are coupled to pads 26 and 24 by means of fine wires 20 and 22, respectively. Metallized layers 12, 14, 24 and 26 may conveniently serve as mounting points for attachment of wires to couple to an electrical power source.

Figure 2:
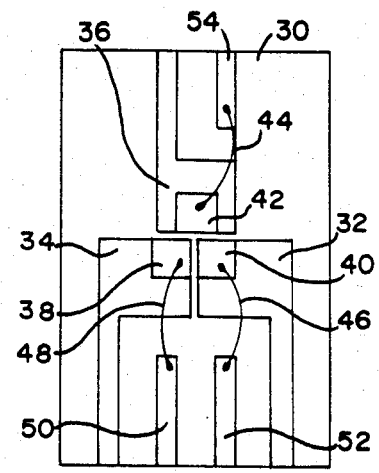
FIG. 2 illustrates a ceramic substrate carrying three LEDs.

FIG. 2 illustrates a second substrate for use in a three wavelength light source. Substrate 30 is preferably a ceramic substrate, bearing metallized layers 32, 34, 36, 50, 52 and 54. Metallized layers, 32, 34, and 36 serve as mounting pads for LEDs 38, 40, and 42, which, again are mounted as close to one another as is possible. LEDs 38, 40 and 42 are coupled to pads 50, 52 and 54, respectively, by fine wires 48, 46 and 44, respectively.

Figure 3:
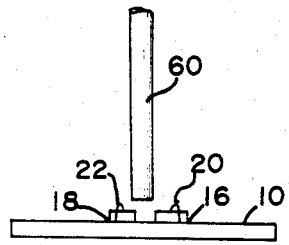
FIG. 3 illustrates a side plan view of the initial location of an optical fiber relative to the substrate illustrated in FIG. 1.

FIG. 3 shows a side view of an optical fiber 60 during positioning relative to the substrate illustrated in FIG. 1, above. LEDs 16 and 18 are coupled to an electrical energy source of the type intended to energize the LEDs during normal use. Optical fiber 60 is held generally perpendicular to substrate 10 and spaced from LEDs 16 and 18 such that the fiber 60 accepts light from both LEDs. The output end of optical fiber 60 should be coupled to monitoring equipment sensitive to light intensity. By intermittently or alternately activating LEDs 16 and 18, the intensities of light generated by the diodes can be compared. The ratio of intensity of the desired frequencies can be adjusted by movement of the input end of optical fiber 60 parallel to substrate 10. Overall intensity can be adjusted by vertical movement of optical fiber 60. When the desired intensities and ratios are obtained, optical fiber 60 should be permanently mounted in place to substrate 10 by means of an optical adhesive, such as a cyanoacrylate, or an ultraviolet curing epoxy.

Figure 4:
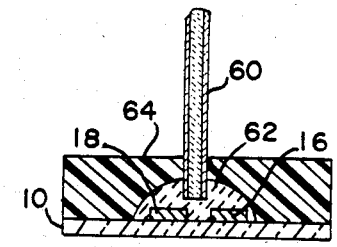
FIG. 4 illustrates a side sectional view of an optical fiber, permanently located and mounted to the substrate of FIG. 1.

FIG. 4 illustrates a side sectional view of the completed multiple wavelength light source. As illustrated, following attachment of optical fiber 60 to the substrate by means of transparent adhesive 62, the assembly is potted in epoxy 64. Following this step, the assembly may be inserted in an outer, protective container.

Figure 5:
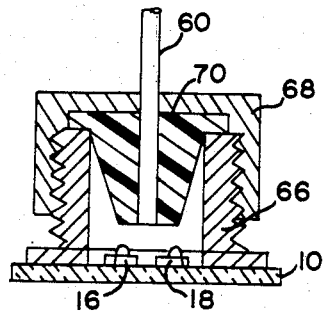
FIG. 5 illustrates a side sectional view of an alternative embodiment of a multiple wavelength light source.

FIG. 5 illustrates a side sectional view of an alternative embodiment of a multiple wavelength light source manufactured according to the present invention. In this embodiment, a light source having a detachable optical fiber is provided. In order to accomplish this method, the optical fiber is premounted in a coupling assembly comprising a threaded male coupling member 66, a correspondingly threaded female coupling member 68, and a fiber locating member 70 which is held in fixed position between coupling members 66 and 68 when these members are screwed together.

The method for manufacture of the light source parallels that described in connection with FIGS. 3 and 4 above except that the fiber and the associated coupling assembly are moved as a unit with respect to the substrate 10 until the desired light mix is achieved. The lower coupling member 66 may then conveniently be bonded to the substrate 10 by means of fast curing UV cured expoxy cement. This assembly allows for removal of the optical fiber 60, when necessary, and for substitution of replacement optical fibers without loss of the desired mix of light frequencies. Control of the intensity of the light source is accomplished by controlling the distance between light emitting diodes 16 and 18 and the end of light fiber 60. Therefore, if it is desired to duplicate the light intensity in a replacement optical fiber, it will be necessary to assure that the configuration of the replacement optical fiber and its associated coupling members duplicates that of the original.

This method has the distinct advantage that it avoids the use of expensive and bulky optical combiners and the use of multiple optical fibers. A multiple wavelength light source constructed according to this method has been found to have an efficiency comparable to a light source constructed in which a plurality of optical fibers are each coupled to an individual light emitting diode, and thereafter mixed in currently available optical mixers. The loss of efficiency due to use of a single light fiber as an optical input source appears to be roughly equivalent to the lost efficiency due to the use of an optical mixer or combiner.

The method of the present invention is believed to be a particularly valuable method for producing multiple wavelength light sources for uses where cost is an important factor because it minimizes the number of components required. It provides a flexible manufacturing method which can produce any desired ratio of light, and a variety of intensity of outputs, using a single set of components. In addition, the manufacturing method produces light sources which are precalibrated, because this manufacturing method necessarily takes into account and compensates for variations in efficiencies of individual light emitting diodes and efficiencies of individual light fibers.

In connection with the above disclosure, we claim:

1. A method of fabrication of a multiple wavelength light source having desired wavelengths and wavelength ratios, comprising the steps of:

selecting at least two light emitting diodes, each diode emitting light at one of said desired wavelengths;

attaching said at least tow light emitting diodes to a common substrate adjacent to one another;

coupling said at least two light emitting diodes to a source of electrical energy to cause them to emit light at said desired wavelengths;

positioning an optical fiber having its first end over said energized light emitting diodes, wherein said second end of said optical fiber is coupled to monitoring equipment sensitive to light amplitude, and wherein said positioning step comprises positioning said first end of said optical fiber spaced from said light emitting diodes such that said desired wavelength ratio is emitted from said second end of said optical fiber; and attaching said first end optical fiber to said substrate at said appropriate location.

2. A method according to claim 1 wherein said step of attaching said optical fiber to said substrate comprises attaching said optical fiber to said substrate by means of a transparent adhesive.

3. A method according to claim 1 wherein said first end of said optical fiber is provided with first and second fitting members, said first fitting member attached to said optical fiber, said second fitting member removably attached to said first fitting member and wherein said step of attaching said fiber to said substrate comprises attaching said second fitting member to said substrate.

4. A method according to claim 1 or claim 2 or claim 3 wherein said positioning step comprises movement of said first end of said optical fiber parallel to said substrate in order to accomplish said desired wavelength ratio.

5. A method according to claim 4 wherein said positioning step further comprises moving said first end of said optical fiber perpendicular to said substrate in order to adjust the amplitude of the light emitted at said second end of said optical fiber.

* * * * *